United States Patent
Yahata

(10) Patent No.: US 11,965,126 B2
(45) Date of Patent: Apr. 23, 2024

(54) FLAME RETARDANT FOR THERMOSETTING RESIN INCLUDING AROMATIC PHOSPHORIC ACID ESTER, THERMOSETTING RESIN COMPOSITION INCLUDING SAME, AND CURED MATERIAL AND APPLICATION OF SAME

(71) Applicant: DAIHACHI CHEMICAL INDUSTRY CO., LTD., Osaka (JP)

(72) Inventor: Shunsuke Yahata, Osaka (JP)

(73) Assignee: DAIHACHI CHEMICAL INDUSTRY CO., LTD., Osaka (JP)

( * ) Notice: Subject to any disclaimer, the term of this patent is extended or adjusted under 35 U.S.C. 154(b) by 567 days.

(21) Appl. No.: 17/263,965

(22) PCT Filed: Jun. 11, 2019

(86) PCT No.: PCT/JP2019/023119
§ 371 (c)(1),
(2) Date: Jan. 28, 2021

(87) PCT Pub. No.: WO2020/031495
PCT Pub. Date: Feb. 13, 2020

(65) Prior Publication Data
US 2021/0309917 A1    Oct. 7, 2021

(30) Foreign Application Priority Data
Aug. 6, 2018   (JP) ................ 2018-147674

(51) Int. Cl.
*C09K 21/12*   (2006.01)
*C07F 9/09*    (2006.01)
(Continued)

(52) U.S. Cl.
CPC .............. *C09K 21/12* (2013.01); *C07F 9/095* (2013.01); *C08J 5/249* (2021.05); *C08K 5/523* (2013.01); *C08L 63/00* (2013.01); *C08J 2363/00* (2013.01)

(58) Field of Classification Search
CPC ... C08K 5/521; C08K 5/523; C08L 63/00–10; C07F 9/09; C09K 21/12
See application file for complete search history.

(56) References Cited

U.S. PATENT DOCUMENTS 4,134,876 A * 1/1979 Horner ................. C08K 5/523
558/162
2002/0137821 A1   9/2002 Seidel et al.
(Continued)

FOREIGN PATENT DOCUMENTS

EP    3 753 998     12/2020
JP    S57-55947 A    4/1982
(Continued)

OTHER PUBLICATIONS

ISR for PCT/JP2019/023119, dated Sep. 3, 2019.
(Continued)

*Primary Examiner* — Kregg T Brooks
(74) *Attorney, Agent, or Firm* — GREENBLUM & BERNSTEIN, P.L.C.

(57) ABSTRACT

A flame retardant for thermosetting resin containing an aromatic phosphoric acid ester represented by the general formula (I):

(Continued)

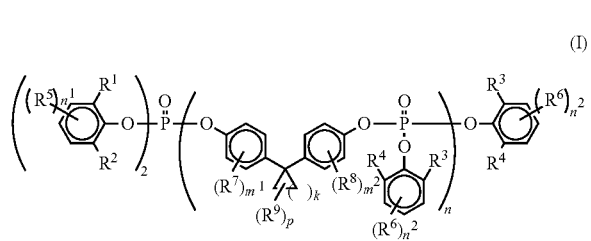

(I)

wherein $R^1$ to $R^4$ each independently represent a hydrogen atom, a $C_{1-4}$ alkyl group, or a $C_{1-4}$ alkoxy group; $R^5$, $R^6$, and $R^9$ each independently represent a $C_{1-10}$ alkyl group or a $C_{1-10}$ alkoxy group; $R^7$ and $R^8$ each independently represent a $C_{1-4}$ alkyl group or a $C_{1-4}$ alkoxy group; n represents an integer of 1 to 10; $n^1$ and $n^2$ each independently represent an integer of 0 to 3; $m^1$ and $m^2$ each independently represent an integer of 0 to 4; p represents an integer of 0 to 26; and k represents an integer of 1 to 12; and when p is 2 or more, any two substituents $R^9$ may be bonded to each other, and may be bonded to a carbon atom(s) of a ring to which the above substituents $R^9$ are bonded, forming another ring.

9 Claims, 4 Drawing Sheets

(51) Int. Cl.
C08J 5/24 (2006.01)
C08K 5/523 (2006.01)
C08L 63/00 (2006.01)

(56) References Cited

U.S. PATENT DOCUMENTS

| | | |
|---|---|---|
| 2003/0191250 A1 | 10/2003 | Seidel et al. |
| 2003/0201548 A1* | 10/2003 | Ikezawa ................ C08K 5/521 257/793 |
| 2007/0225412 A1 | 9/2007 | Buchholz et al. |
| 2007/0225441 A1 | 9/2007 | Wenz et al. |
| 2016/0024304 A1 | 1/2016 | You |
| 2018/0127547 A1 | 5/2018 | Tanigawa et al. |
| 2021/0054173 A1 | 2/2021 | Tsuji et al. |

FOREIGN PATENT DOCUMENTS

| | | |
|---|---|---|
| JP | 2002-284963 A | 10/2002 |
| JP | 2004-051907 A | 2/2004 |
| JP | 2004-527474 A | 9/2004 |
| JP | 2005-520905 A | 7/2005 |
| JP | 2006-117723 A | 5/2006 |
| JP | 2009-530455 A | 8/2009 |
| JP | 2009-530456 A | 8/2009 |
| JP | 2013-177599 A | 9/2013 |
| JP | 2016-60881 A | 4/2016 |
| JP | 6890360 B2 | 5/2021 |
| WO | WO 2002/055526 A1 | 7/2002 |
| WO | WO 2016/175325 A1 | 11/2016 |
| WO | WO 2017/094489 A1 | 6/2017 |

OTHER PUBLICATIONS

Written opinion for PCT/JP2019/023119, dated Sep. 3, 2019.
Wawrzyn et al., "Are novel aryl phosphates competitors for bisphenol A bis(diphenyl phosphate) in halogen-free flame-retarded polycarbonate/acrylonitrile-butadiene-styrene blends?", European Polymer Journal, 48:1561-1574, (2012).
European search Report issued with respect to European Application No. 19847820.8, dated Apr. 4, 2022.

* cited by examiner

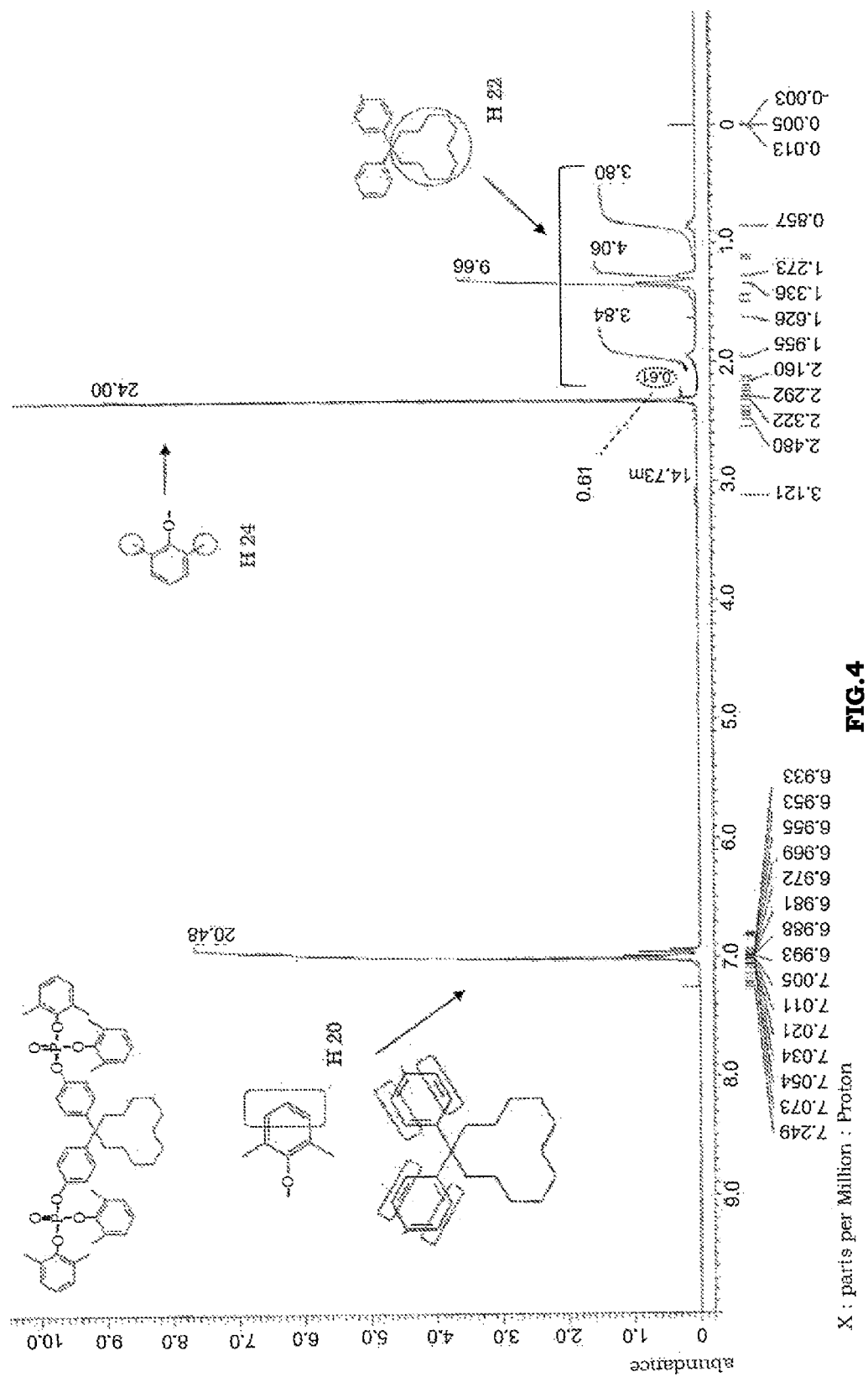

FLAME RETARDANT FOR THERMOSETTING RESIN INCLUDING AROMATIC PHOSPHORIC ACID ESTER, THERMOSETTING RESIN COMPOSITION INCLUDING SAME, AND CURED MATERIAL AND APPLICATION OF SAME

TECHNICAL FIELD

The present invention relates to a flame retardant for thermosetting resin including an aromatic phosphoric acid ester, a thermosetting resin composition including the flame retardant, a cured material (thermoset article) of the composition, and an application of the thermoset article.

BACKGROUND ART

In computers, cameras, mobile telephones, liquid crystal displays (LCD), TFT displays, and other electronic devices, a laminate sheet is used that is made of various materials, such as a synthetic resin (thermosetting resin or thermoplastic resin). Of these materials, the thermosetting resin, such as an epoxy resin, has excellent characteristics and has been traditionally used.

The materials for the laminate sheet are required to have various characteristics depending upon its use, use conditions, and so forth; and one of the characteristics required is flame retardancy.

In general, how to impart flame retardancy to a resin material is to allow a resin to contain a halogen compound, such as a bromine-type flame retardant (namely, to add the halogen compound to the resin). In recent years, however, a halogen-free laminate sheet that is unlikely to generate any harmful gas during burning has been required with consideration for the human body and the natural environment.

To accommodate such a demand, there is a way to allow a resin to contain a halogen-free phosphorus-type flame retardant (namely, to add the halogen-free phosphorus-type flame retardant to the resin).

Various studies have been conducted on phosphorus-type flame retardants, for example, a condensed phosphoric acid ester as disclosed in Japanese Unexamined Patent Application Publication No. 2004-051907 (Patent Document 1). However, by making soldering for wiring lead-free, with consideration for the human body and the natural environment, in the same way as the materials for the laminate sheet, the materials for the laminate sheet were required to have higher heat resistance. Since the traditionally-used condensed phosphoric acid ester reduced a glass-transition temperature of a thermoset resin article, the condensed phosphoric acid ester had a problem of not being able to meet sufficient performance as the laminate sheet.

Considering the above problem, another approach was taken such that phosphinate as disclosed in Japanese Unexamined Patent Application Publication No. 2002-284963 (Patent Document 2) was used as a phosphorus-type flame retardant so as to reduce a drop in glass-transition temperature. The phosphinate, however, is insoluble in a solvent that is commonly used to prepare the laminate sheet (prepreg), and thus does not disperse well in a resin, with the result that the phosphinate has a problem of not being able to stably impart flame retardancy to the resin.

As examples of the phosphorus-type flame retardant soluble in the solvent that is commonly used to prepare the laminate sheet (prepreg), there may be mentioned 9,10-dihydro-9-oxa-10-phosphaphenanthrene-10-oxide (DOPO) and its modified compounds as disclosed in Japanese Unexamined Patent Application Publication No. 2013-177599 (Patent Document 3) and phosphazene compounds as disclosed in Japanese Unexamined Patent Application Publication No. 2006-117723 (Patent Document 4); and these compounds are actually used.

In recent years, due to highly-developed communication networks, the amount of information circulating in society is increasing at an accelerated rate. Therefore, the information processing of various electronic devices is getting faster; and frequencies of electrical signals are getting higher, with the result that the laminate sheet is required to have lower inductance in order to reduce any signal transmission loss. The DOPO of Patent Document 3 and the phosphazene compounds of Patent Document 4 tend to elevate permittivity and dielectric tangent of the laminate sheet, giving a challenge to be solved.

PCT International Publication No. WO 2016/175325 (Patent Document 5) and U.S. Patent Publication No. 2016/0024304 (Patent Document 6) disclose a phosphorus-type flame retardant-containing thermoset resin article that is excellent in flame retardancy and heat resistance and is capable of suppressing an increase in permittivity and dielectric tangent. The thermoset resin article of Patent Document 5 is characterized by containing a specific polyphenylene ether derivative, while the thermoset resin article of Patent Document 6 is characterized by containing a specific epoxy compound. Namely, the flame retardants themselves are not featured in these documents; and further improvement in the performance of the phosphorus-type flame retardant-containing laminate sheet is desired.

CITATION LIST

Patent Literature

Patent Document 1: Japanese Unexamined Patent Application Publication No. 2004-051907
Patent Document 2: Japanese Unexamined Patent Application Publication No. 2002-284963
Patent Document 3: Japanese Unexamined Patent Application Publication No. 2013-177599
Patent Document 4: Japanese Unexamined Patent Application Publication No. 2006-117723
Patent Document 5: PCT International Publication No. WO 2016/175325
Patent Document 6: U.S. Patent Publication No. 2016/0024304

SUMMARY OF INVENTION

Technical Problem

The present invention has an object of providing an organic phosphorus-type flame retardant for thermosetting resin, a thermosetting resin composition including the flame retardant, a thermoset article of the composition, and an application of the thermoset article, the flame retardant having the following features: soluble in a solvent that is commonly used to prepare the thermoset resin article; capable of imparting sufficient flame retardancy to the thermoset resin article even without containing any halogen; and capable of suppressing an elevation in permittivity and dielectric tangent and a decrease in heat resistance.

Solution to Problem

As a result of diligent research to achieve the above object, the inventor of the present invention found that an aromatic phosphoric acid ester having a bisphenol structure having a specific aliphatic ring in a cross-linked structure can achieve the above object, and completed the present invention.

The present invention provides a flame retardant for thermosetting resin containing an aromatic phosphoric acid ester represented by the general formula (I):

The flame retardant for thermosetting resin of the present invention exhibits the above advantageous effects more if any one of the following conditions (1) to (4) is satisfied:

(1) The aromatic phosphoric acid ester is represented by the general formula (I) wherein $R^1$ to $R^4$ each independently represent a $C_{1-4}$ alkyl group or a $C_{1-4}$ alkoxy group.

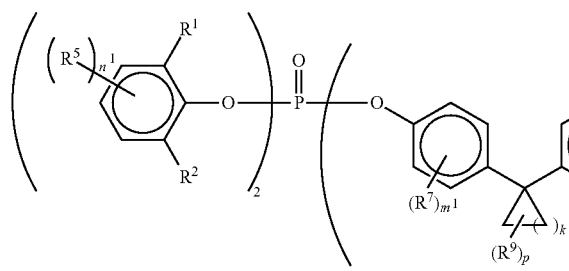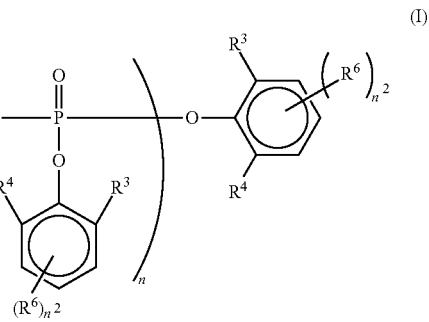

(I)

wherein $R^1$ to $R^4$ each independently represent a hydrogen atom, a $C_{1-4}$ alkyl group, or a $C_{1-4}$ alkoxy group; $R^5$, $R^6$, and $R^9$ each independently represent a $C_{1-10}$ alkyl group or a $C_{1-10}$ alkoxy group; $R^7$ and $R^8$ each independently represent a $C_{1-4}$ alkyl group or a $C_{1-4}$ alkoxy group; n represents an integer of 1 to 10; $n^1$ and $n^2$ each independently represent an integer of 0 to 3; $m^1$ and $m^2$ each independently represent an integer of 0 to 4; p represents an integer of 0 to 26; and k represents an integer of 1 to 12; and when p is 2 or more, any two substituents $R^9$ may be bonded to each other, and may be bonded to a carbon atom(s) of a ring to which the above substituents $R^9$ are bonded, forming another ring.

The present invention also provides a thermosetting resin composition containing the above-described flame retardant for thermosetting resin and a thermosetting resin, and further provides a thermoset resin article formed by curing the thermosetting resin composition.

The present invention also provides a prepreg containing the above-described thermosetting resin composition.

The present invention further provides a laminate sheet prepared using the above-described prepreg, and also provides a printed wiring board prepared using the above-described prepreg or the above-described laminate sheet.

Advantageous Effects of Invention

The present invention can provide an organic phosphorus-type flame retardant for thermosetting resin, a thermosetting resin composition containing the flame retardant, a thermoset article containing the composition, and an application of the thermoset article, the flame retardant having the following features: soluble in a solvent that is commonly used to prepare the thermoset resin article; capable of imparting sufficient flame retardancy to the thermoset resin article even without containing any halogen; and capable of suppressing a rise in permittivity and dielectric tangent and a reduction in heat resistance.

(2) The aromatic phosphoric acid ester is represented by the general formula (I) wherein n represents 1, p represents an integer of 0 to 10, and k represents 4.

(3) The aromatic phosphoric acid ester is represented by the general formula (I) wherein n represents 1, p represents an integer of 0 to 22, and k represents 10.

(4) The aromatic phosphoric acid ester is any of aromatic phosphoric acid esters 1 to 4 described in Embodiments.

The thermosetting resin composition of the present invention exhibits the above advantageous effects more if either one of the following conditions (5) and (6) is satisfied:

(5) The thermosetting resin is an epoxy resin.

(6) The flame retardant for thermosetting resin of 1 to 50% by mass is contained in the thermosetting resin composition.

BRIEF DESCRIPTION OF DRAWINGS

FIG. 4 shows a $^1$H-NMR chart of aromatic phosphoric acid ester 4 of Synthesis Example 3.

DESCRIPTION OF EMBODIMENTS

Figure 1:
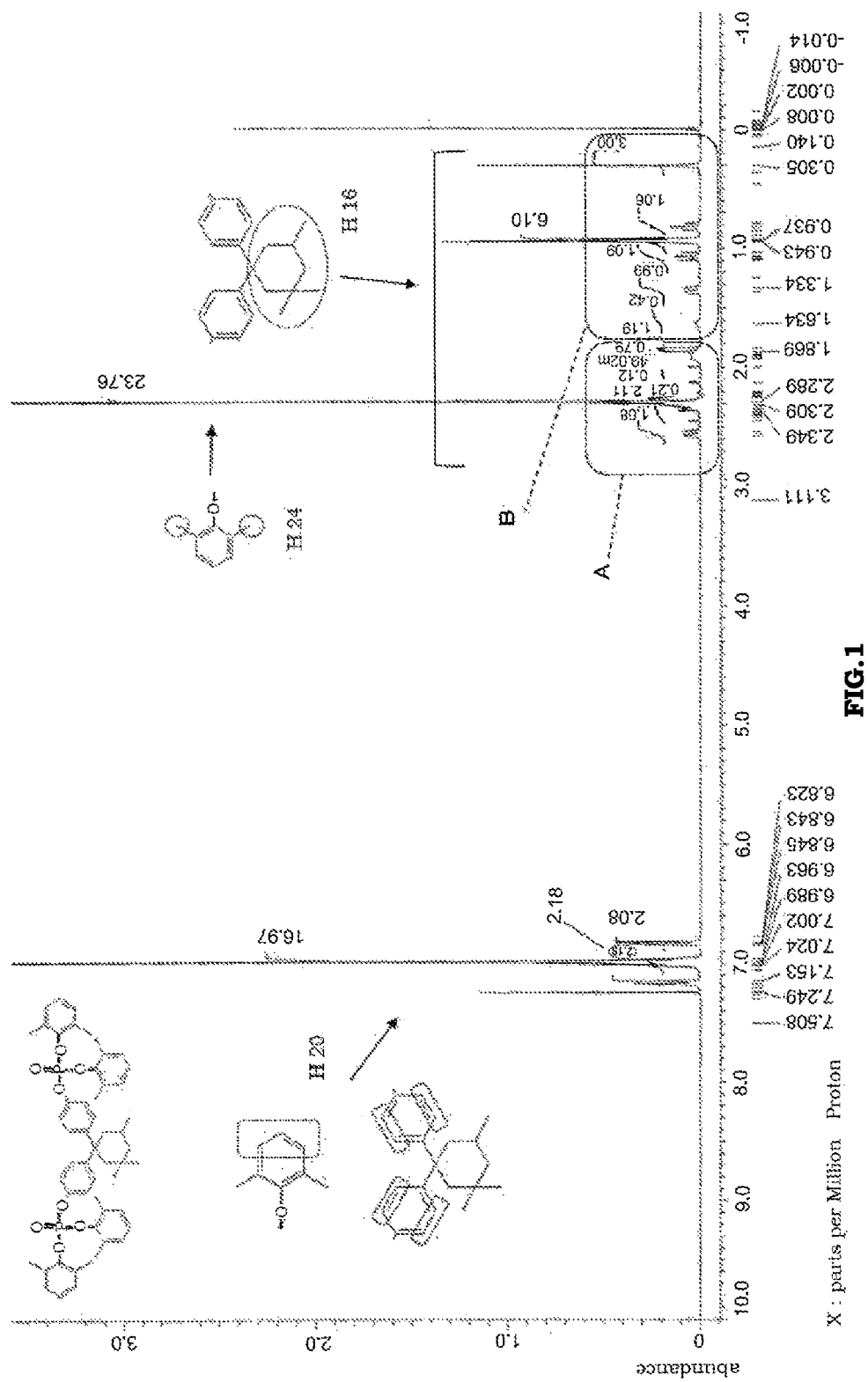
FIG. 1 shows a $^1$H-NMR chart of aromatic phosphoric acid ester 1 of Synthesis Example 2.

1. Flame Retardant for Thermosetting Resin Including Aromatic Phosphoric Acid Ester A flame retardant for thermosetting resin of the present invention is characterized by comprising an aromatic phosphoric acid ester represented by the general formula (I):

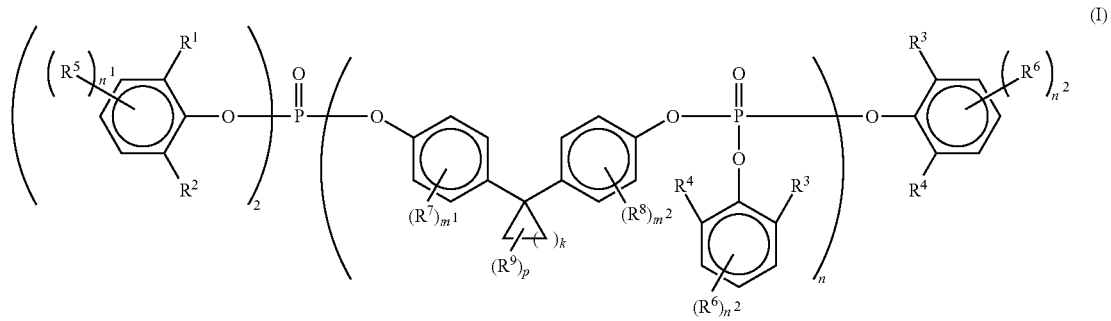

wherein $R^1$ to $R^4$ each independently represent a hydrogen atom, a $C_{1-4}$ alkyl group, or a $C_{1-4}$ alkoxy group; $R^5$, $R^6$, and $R^9$ each independently represent a $C_{1-10}$ alkyl group or a $C_{1-10}$ alkoxy group; $R^7$ and $R^8$ each independently represent a $C_{1-4}$ alkyl group or a $C_{1-4}$ alkoxy group; n represents an integer of 1 to 10; $n^1$ and $n^2$ each independently represent an integer of 0 to 3; $m^1$ and $m^2$ each independently represent an integer of 0 to 4; p represents an integer of 0 to 26; and k represents an integer of 1 to 12; and when p is 2 or more, any two substituents $R^9$ may be bonded to each other, and may be bonded to a carbon atom(s) of a ring to which the above substituents $R^9$ are bonded, forming another ring.

The substituents $R^1$ to $R^4$ in the general formula (I) represent the hydrogen atom; the $C_{1-4}$ alkyl group, preferably a $C_{1-3}$ alkyl group, and more preferably a $C_{1-2}$ alkyl group; or the $C_{1-4}$ alkoxy group, preferably a $C_{1-3}$ alkoxy group, and more preferably a $C_{1-2}$ alkoxy group. The substituents $R^1$ to $R^4$ representing the hydrogen atom or the alkyl or the alkoxy group whose carbon number falls within the above-mentioned ranges make it possible to provide the aromatic phosphoric acid ester that is capable of imparting excellent flame retardancy and dielectric property to a thermoset resin article, and also make it possible to relatively easily synthesize the aromatic phosphoric acid ester.

As described above, the substituents $R^1$ to $R^4$ represent the hydrogen atom, the alkyl group having the specific carbon number, or the alkoxy group having the specific carbon number; however, it is preferable that the substituents should represent the hydrogen atom or the alkyl group, and it is more preferable that the substituents should represent the alkyl group.

The $C_{1-4}$ alkyl group may be linear or branched; and examples of the $C_{1-4}$ alkyl group include a methyl group, an ethyl group, an n-propyl group, an isopropyl group, an n-butyl group, an isobutyl group, and a tert-butyl group.

Of the above-listed alkyl groups, the methyl group, the ethyl group, the n-propyl group, and the isopropyl group are preferable; and the methyl group and the ethyl group are particularly preferable.

The $C_{1-4}$ alkoxy group may be linear or branched; and examples of the $C_{1-4}$ alkoxy group include a methoxy group, an ethoxy group, an n-propoxy group, an isopropoxy group, an n-butoxy group, an isobutoxy group, and a tert-butoxy group.

Of the above-listed alkoxy groups, the methoxy group, the ethoxy group, the n-propoxy group, and the isopropoxy group are preferable; and the methoxy group and the ethoxy group are particularly preferable.

The substituents $R^5$, $R^6$, and $R^9$ in the general formula (I) represent the $C_{1-10}$ alkyl group, preferably a $C_{1-6}$ alkyl group, and more preferably a $C_{1-4}$ alkyl group, or represent the $C_{1-10}$ alkoxy group, preferably a $C_{1-6}$ alkoxy group, and more preferably a $C_{1-4}$ alkoxy group. If the carbon number falls within the above-mentioned ranges, the aromatic phosphoric acid ester can be obtained that is capable of imparting excellent flame retardancy to the thermoset resin article.

The $C_{1-10}$ alkyl group may be linear or branched; and examples of the $C_{1-10}$ alkyl group include a methyl group, an ethyl group, an n-propyl group, an isopropyl group, an n-butyl group, an isobutyl group, a tert-butyl group, an n-pentyl group, an isopentyl group, a 2-methylbutyl group, a 1-methylbutyl group, a 1,2-dimethylpropyl group, a neopentyl group (2,2-dimethylpropyl group), a tert-pentyl group (1,1-dimethylpropyl group), an n-hexyl group, an isohexyl group, a 1-methylpentyl group, a 2-methylpentyl group, a 3-methylpentyl group, a 1-ethylbutyl group, a 2-ethylbutyl group, a 1,1-dimethylbutyl group, a 1,2-dimethylbutyl group, a 1,3-dimethylbutyl group, a 2,2-dimethylbutyl group, a 2,3-dimethylbutyl group, a 1-ethyl-1-methylpropyl group, a 1-ethyl-2-methylpropyl group, an n-heptyl group, an isoheptyl group, a 1-methylhexyl group, a 2-methylhexyl group, a 3-methylhexyl group, a 4-methylhexyl group, a 1-ethylpentyl group, a 2-ethylpentyl group, a 3-ethylpentyl group, a 1-propylbutyl group, a 1,1-dimethylpentyl group, a 1,2-dimethylpentyl group, a 1,3-dimethylpentyl group, a 1,4-dimethylpentyl group, a 1-ethyl-1-methylbutyl group, a 1-ethyl-2-methylbutyl group, a 1-ethyl-3-methylbutyl group, a 2-ethyl-1-methylbutyl group, a 2-ethyl-2-methylbutyl group, a 2-ethyl-3-methylbutyl group, a 1,1-diethylpropyl group, an n-octyl group, an isooctyl group, a 1-methylheptyl group, a 2-methylheptyl group, a 3-methylheptyl group, a 4-methylheptyl group, a 5-methylheptyl group, a 1-ethylhexyl group, a 2-ethylhexyl group, a 3-ethylhexyl group, a 4-ethylhexyl group, a 1-propylheptyl group, a 2-propylheptyl group, a nonyl group, and a decyl group.

Of the above-listed $C_{1-10}$ alkyl groups, the following are preferable: the methyl group, the ethyl group, the n-propyl group, the isopropyl group, the n-butyl group, the isobutyl group, the tert-butyl group, the n-pentyl group, the isopentyl group, the 2-methylbutyl group, the 1-methylbutyl group, the 1,2-dimethylpropyl group, the neopentyl group (2,2-dimethylpropyl group), the tert-pentyl group (1,1-dimethylpropyl group), the n-hexyl group, the isohexyl group, the 1-methylpentyl group, the 2-methylpentyl group, the 3-methylpentyl group, the 1-ethylbutyl group, the 2-ethylbutyl group, the 1,1-dimethylbutyl group, the 1,2-dimethylbutyl group, the 1,3-dimethylbutyl group, the 2,2-dimethylbutyl group, the 2,3-dimethylbutyl group, the 1-ethyl-1-methylpropyl group, and the 1-ethyl-2-methylpropyl group; and the following are particularly preferable: the methyl group, the ethyl group, the n-propyl group, the isopropyl group, the n-butyl group, the isobutyl group, and the tert-butyl group.

The $C_{1-10}$ alkoxyl group may be linear or branched; and examples of the $C_{1-10}$ alkoxyl group include a methoxy group, an ethoxy group, an n-propoxy group, an isopropoxy group, an n-butoxy group, an isobutoxy group, a tert-butoxy group, an n-pentyloxy group, an isopentyloxy group, a 2-methylbutoxy group, a 1-methylbutoxy group, a 1,2-dimethylpropoxy group, a neopentyloxy group (2,2-dimethylpropoxy group), a tert-pentyloxy group (1,1-dimethylpropoxy group), an n-hexyloxy group, an isohexyloxy group, a 1-methylpentyloxy group, a 2-methylpentyloxy group, a 3-methylpentyloxy group, a 1-ethylbutoxy group, a 2-ethylbutoxy group, a 1,1-dimethylbutoxy group, a 1,2-dimethylbutoxy group, a 1,3-dimethylbutoxy group, a 2,2-dimethylbutoxy group, a 2,3-dimethylbutoxy group, a 1-ethyl-1-methylpropoxy group, a 1-ethyl-2-methylpropoxy group, an n-heptyloxy group, an isoheptyloxy group, a 1-methylhexyloxy group, a 2-methylhexyloxy group, a 3-methylhexyloxy group, a 4-methylhexyloxy group, a 1-ethylpentyloxy group, a 2-ethylpentyloxy group, a 3-ethylpentyloxy group, a 1-propylbutoxy group, a 1,1-dimethylpentyloxy group, a 1,2-dimethylpentyloxy group, a 1,3-dimethylpentyloxy group, a 1,4-dimethylpentyloxy group, a 1-ethyl-1-methylbutoxy group, a 1-ethyl-2-methylbutoxy group, a 1-ethyl-3-methylbutoxy group, a 2-ethyl-1-methylbutoxy group, a 2-ethyl-2-methylbutoxy group, a 2-ethyl-3-methylbutoxy group, a 1,1-diethylpropoxy group, an n-octyloxy group, an isooctyloxy group, a 1-methylheptyloxy group, a 2-methylheptyloxy group, a 3-methylheptyloxy group, a 4-methylheptyloxy group, a 5-methylheptyloxy group, a 1-ethylhexyloxy group, a 2-ethylhexyloxy group, a 3-ethylhexyloxy group, a 4-ethylhexyloxy group, a 1-propylheptyloxy group, a 2-propylheptyloxy group, a nonyloxy group, and a decyloxy group.

Of the above-listed $C_{1-10}$ alkoxy groups, the following are preferable: the methoxy group, the ethoxy group, the n-propoxy group, the isopropoxy group, the n-butoxy group, the isobutoxy group, the tert-butoxy group, the n-pentyloxy group, the isopentyloxy group, the 2-methylbutoxy group, the 1-methylbutoxy group, the 1,2-dimethylpropoxy group, the neopentyloxy group (2,2-dimethylpropoxy group), and the tert-pentyloxy group (1,1-dimethylpropoxy group), the n-hexyloxy group, the isohexyloxy group, the 1-methylpentyloxy group, the 2-methylpentyloxy group, the 3-methylpentyloxy group, the 1-ethylbutoxy group, the 2-ethylbutoxy group, the 1,1-dimethylbutoxy group, the 1,2-dimethylbutoxy group, the 1,3-dimethylbutoxy group, the 2,2-dimethylbutoxy group, the 2,3-dimethylbutoxy group, the 1-ethyl-1-methylpropoxy group, and the 1-ethyl-2-methylpropoxy group; and the following are particularly preferable: the methoxy group, the ethoxy group, the n-propoxy group, the isopropoxy group, the n-butoxy group, the isobutoxy group, and the tert-butoxy group.

The substituents $R^7$ and $R^8$ in the general formula (I) represent the $C_{1-4}$ alkyl group, preferably a $C_{1-3}$ alkyl group, and more preferably a $C_{1-2}$ alkyl group; or the $C_{1-4}$ alkoxy group, preferably a $C_{1-3}$ alkoxy group, and more preferably a $C_{1-2}$ alkoxy group. If the carbon number falls within the above-mentioned ranges, the aromatic phosphoric acid ester can be obtained that is capable of imparting excellent flame retardancy and dielectric property to the thermoset resin article, and can be relatively easily synthesized.

The $C_{1-4}$ alkyl group may be linear or branched; and examples of the $C_{1-4}$ alkyl group include a methyl group, an ethyl group, an n-propyl group, an isopropyl group, an n-butyl group, an isobutyl group, and a tert-butyl group.

Of the above-listed alkyl groups, the methyl group, the ethyl group, the n-propyl group, and the isopropyl group are preferable; and the methyl group and the ethyl group are particularly preferable.

The $C_{1-4}$ alkoxy group may be linear or branched; and examples of the $C_{1-4}$ alkoxy group include a methoxy group, an ethoxy group, an n-propoxy group, an isopropoxy group, an n-butoxy group, an isobutoxy group, and a tert-butoxy group.

Of the above-listed alkoxy groups, the methoxy group, the ethoxy group, the n-propoxy group, and the isopropoxy group are preferable; and the methoxy group and the ethoxy group are particularly preferable.

Two types of the groups from among the alkyl groups and the alkoxy groups may be present in a single molecule; or only one type of the group from among the alkyl groups and the alkoxy groups may be present; however, it is particularly preferable that only the alkyl group should be present.

Indexes in the general formula (I) are as follows.

n represents an integer of 1 to 10, preferably 1 to 5, more preferably 1 to 3, and further preferably 1.

$n^1$ and $n^2$ each independently represent an integer of 0 to 3, preferably 0 or 1, and more preferably 0.

$m^1$ and $m^2$ each independently represent an integer of 0 to 4, preferably 0 to 2, and more preferably 0.

p represents an integer of 0 to 26, preferably 0 to 22, more preferably 0 to 10, further preferably 0 to 5, and particularly preferably 0 to 3.

k represents an integer of 1 to 12, preferably 3 to 10, and more preferably 4 or 10.

The aromatic phosphoric acid ester having the indexes that fall within the above-mentioned ranges is capable of imparting excellent dielectric property and high heat resistance and flame retardancy to the thermoset resin article to which the aromatic phosphoric acid ester is added.

The definition "when p is 2 or more, any two substituents $R^9$ may be bonded to each other, and may be bonded to a carbon atom(s) of a ring to which the above substituents $R^9$ are bonded, forming another ring" regarding the general formula (I) means that a structure such as the one shown below may be formed:

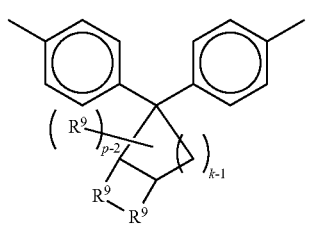

wherein $R^9$, p, and k are as defined in the general formula (I).

As a specific example there may be mentioned a structure represented by the following formula:

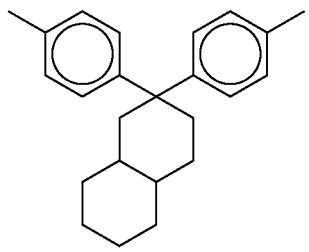

It is desirable that the aromatic phosphoric acid ester to be contained in the flame retardant of the present invention should comprise main components whose indexes fall within the above-mentioned ranges; however, the aromatic phosphoric acid ester may be a mixture of the components whose indexes are different. The aromatic phosphoric acid ester may, however, contain the components whose indexes fall outside the above-mentioned ranges, as long as the components do not hinder the advantageous effects of the present invention.

As desirable examples of the aromatic phosphoric acid ester of the present invention there may be mentioned as follows:

a compound represented by the following general formula (II) derived from the general formula (I) wherein n represents 1, p represents an integer of 0 to 10, and k represents 4:

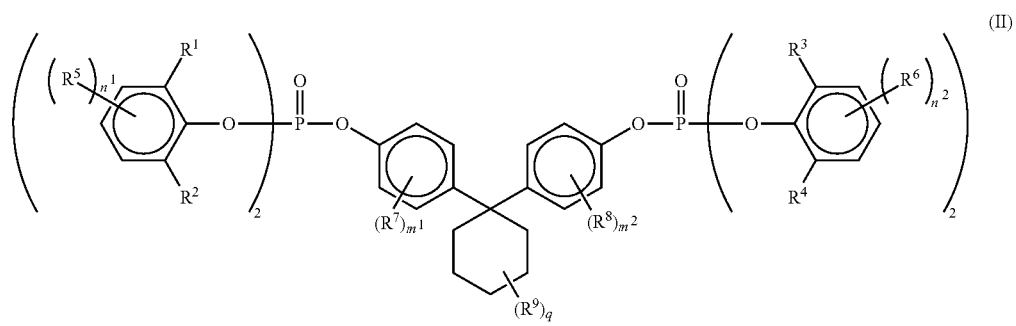

(II)

wherein $R^1$ to $R^9$, $n^1$, $n^2$, $m^1$, and $m^2$ are as defined in the general formula (I); and q represents an integer of 0 to 10, preferably 0 to 5, and more preferably 0 to 3; and a compound represented by the following general formula (III) derived from the general formula (I) wherein n represents 1, p represents an integer of 0 to 22, and k represents 10:

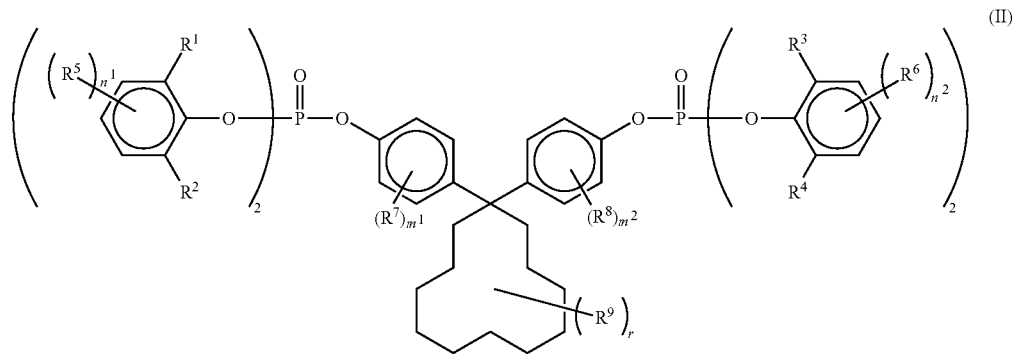

(II)

wherein R¹ to R⁹, $n^1$, $n^2$, $m^1$, and $m^2$ are as defined in the general formula (I); and r represents an integer of 0 to 22, preferably 0 to 10, more preferably 0 to 5, particularly preferably 0 to 3, and most preferably 0.

As specific examples of the aromatic phosphoric acid ester of the present invention there may be mentioned aromatic phosphoric acid esters 1 to 4 having the following structural formulas; and any compound selected from these compounds can be suitably used for the present invention. Of these compounds, the aromatic phosphoric acid esters 1, 3, and 4 are preferable; the aromatic phosphoric acid esters 1 and 4 are more preferable; and the aromatic phosphoric acid ester 1 is particularly preferable, in terms of production costs.

Aromatic Phosphoric Acid Ester 1:

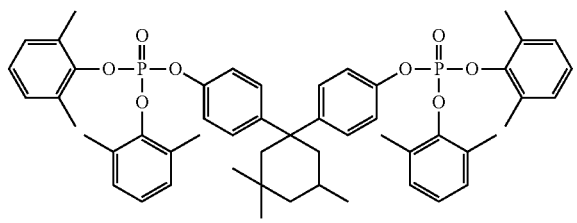 [SMILES: Cc1cccc(C)c1OP(=O)(Oc1ccc(C2(c3ccc(OP(=O)(Oc4c(C)cccc4C)Oc4c(C)cccc4C)cc3)CC(C)CC(C)(C)C2)cc1)Oc1c(C)cccc1C]

Aromatic Phosphoric Acid Ester 2:

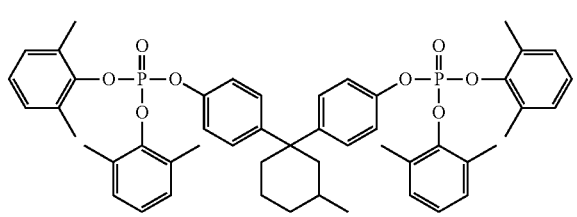 [SMILES: Cc1cccc(C)c1OP(=O)(Oc1ccc(C2(c3ccc(OP(=O)(Oc4c(C)cccc4C)Oc4c(C)cccc4C)cc3)CCCC(C)C2)cc1)Oc1c(C)cccc1C]

Aromatic Phosphoric Acid Ester 3:

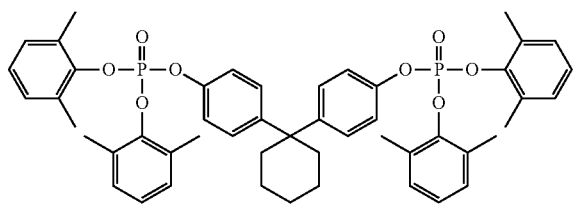 [SMILES: Cc1cccc(C)c1OP(=O)(Oc1ccc(C2(c3ccc(OP(=O)(Oc4c(C)cccc4C)Oc4c(C)cccc4C)cc3)CCCCC2)cc1)Oc1c(C)cccc1C]

Aromatic Phosphoric Acid Ester 4:

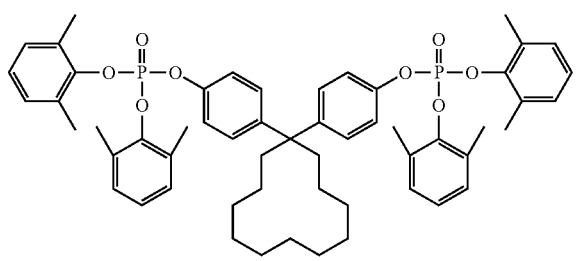 [SMILES: Cc1cccc(C)c1OP(=O)(Oc1ccc(C2(c3ccc(OP(=O)(Oc4c(C)cccc4C)Oc4c(C)cccc4C)cc3)CCCCCCCCCCC2)cc1)Oc1c(C)cccc1C]

2. Method for Synthesizing Aromatic Phosphoric Acid Esters

The flame retardant of the present invention is synthesized by a commonly-known method with use of corresponding phenols, bisphenols, and phosphorus oxychloride as materials.

For example, an intended aromatic phosphoric acid ester may be obtained as follows:

a phenol represented by the general formula (IV):

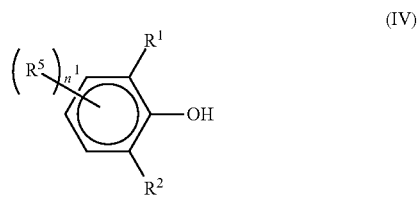

(IV)

wherein R¹, R², R⁵, and $n^1$ are as defined in the general formula (I) and phosphorus oxychloride are subjected to a dehydrochlorination reaction in the presence of a Lewis acid catalyst, such as aluminum chloride or magnesium chloride, obtaining a diester compound represented by the general formula (V):

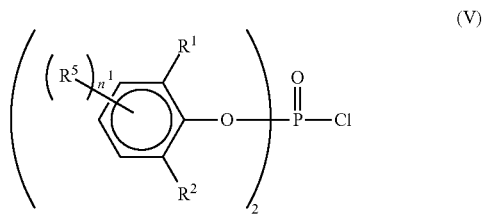

(V)

wherein R¹, R², R⁵, and $n^1$ are as defined in the general formula (I); and the diester compound thereby obtained and a bisphenol compound represented by the general formula (VI):

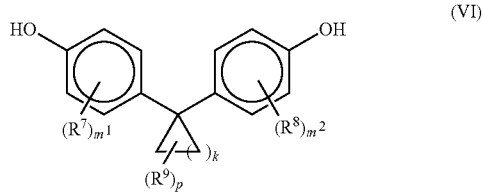

(VI)

wherein R⁷, R⁸, R⁹, $m^1$, $m^2$, p, and k are as defined in the general formula (I)

are subjected to a dehydrochlorination reaction in the presence of a Lewis acid catalyst or to an esterification reaction using a hydrogen chloride scavenger, such as pyridine, triethylamine, or tributylamine, obtaining an intended aromatic phosphoric acid ester; or the bisphenol represented by the general formula (VI) and phosphorus oxychloride are subjected to a dehydrochlorination reaction in the presence of a Lewis acid catalyst or to an esterification reaction using a hydrogen chloride scavenger, such as pyridine, triethylamine, or tributylamine, obtaining a phosphorus compound represented by the general formula (VII):

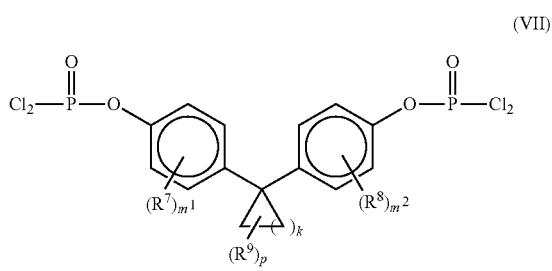

(VII)

wherein $R^7$, $R^8$, $R^9$, $m^1$, $m^2$, p, and k are as defined in the general formula (I); and the phosphorus compound thereby obtained and the phenol represented by the above-mentioned general formula (IV) are subjected to a dehydrochlorination reaction in the presence of a Lewis acid catalyst or to an esterification reaction using a hydrogen chloride scavenger, such as pyridine, triethylamine, or tributylamine, obtaining an intended aromatic phosphoric acid ester.

3. Thermosetting Resin Composition

A thermosetting resin composition of the present invention is characterized by containing the above-described flame retardant for thermosetting resin and a thermosetting resin.

If necessary, the thermosetting resin composition of the present invention may contain a curing agent, a curing accelerator, and other additives; and the thermosetting resin composition of the present invention means a mixture of these components before the components cure.

Thermosetting Resin

The thermosetting resin to which the flame retardancy is to be imparted is not particularly limited, as long as the resin has thermosetting property; and examples of the thermosetting resin include an epoxy resin, an unsaturated polyester resin, a vinylester resin, a diallyl phthalate resin, a maleimide resin, a cyanic ester resin, a phenolic resin, a melamine resin, and a polyurethane resin. Of these resins, the epoxy resin is particularly preferable because a thermoset article thereof excels in mechanical and electrical properties.

As examples of the epoxy resin there may be mentioned compounds having a plurality of epoxy groups in molecules thereof; and specific examples of the epoxy resin include bisphenol-type epoxy resins, novolac-type epoxy resins, aliphatic chain epoxy resins, epoxidized polybutadienes, glycidyl ester-type epoxy resins, and glycidyl amine-type epoxy resins.

Of these epoxy resins, the following are preferable: the bisphenol-type epoxy resins, such as a bisphenol A-type epoxy resin, a bisphenol F-type epoxy resin, and a bisphenol S-type epoxy resin; and the novolac-type epoxy resins, such as a cresol novolac-type epoxy resin, a bisphenol-A novolac-type epoxy resin, and a salicylaldehyde phenol novolac-type epoxy resin. From the viewpoint of improvement in the heat resistance, the bisphenol A-type epoxy resin, the bisphenol-A novolac-type epoxy resin, the cresol novolac-type epoxy resin, and the salicylaldehyde phenol novolac-type epoxy resin are particularly preferable.

The above-mentioned resins can be used independently or in combination of two or more kinds thereof.

The unsaturated polyester resin is a compound that is obtained by an esterification reaction between a polyol, such as ethylene glycol, propylene glycol, diethylene glycol, or hydrogenated bisphenol-A hydride, and an unsaturated polybasic acid, such as maleic acid, fumaric acid, or itaconic acid, or a saturated polybasic acid, such as adipic acid or phthalic acid; and the compound has a plurality of ester bonds and radical polymerization unsaturated bonds in molecules thereof.

The vinylester resin is a compound that is obtained by reaction between a compound having a plurality of epoxy groups in molecules thereof, such as a bisphenol A-type epoxy resin or a novolac-type epoxy resin, and acrylic acid or methacrylic acid, and has a plurality of acryloyl groups or methacryloyl groups in molecules thereof.

The diallyl phthalate resin is generally formed of a mixture of a diallyl phthalate prepolymer, which is pre-polymerized diallyl phthalate, and a diallyl phthalate monomer. The diallyl phthalate prepolymer and the diallyl phthalate may be in the ortho position, the iso position, or the para position.

Any of the unsaturated polyester resin, the vinylester resin, and the diallyl phthalate resin may be used in combination with a co-reactant and/or a curing catalyst. The co-reactant may be a compound having a radical polymerization unsaturated bond; and examples of the co-reactant include styrene, divinylbenzene, and (meth)acrylate ester.

As examples of the curing catalyst to be used in the unsaturated polyester resin, the vinylester resin, and the diallyl phthalate resin, there may be mentioned organic peroxides.

A curing auxiliary agent may also be used with the curing catalyst; and as examples of the curing auxiliary agent there may be mentioned transition metal organic acid salts, such as cobalt and vanadium, and tertiary amines, such as dimethylaniline and dimethylaminopyridine.

The maleimide resin is a compound having a plurality of maleimide groups in molecules thereof; and as an example of the maleimide resin there may be mentioned methylenebis-p-phenylenedimaleimide. The maleimide compound may be used in combination with a co-reactant and/or a curing catalyst. As examples of the co-reactant there may be mentioned compounds having a functional group, such as an alkenyl group, an epoxy group, an amino group, a phenolic hydroxyl group, or a cyanate group; and as examples of the curing catalyst there may be mentioned strongly basic compounds, such as imidazole derivatives and diazabicyclooctane.

The cyanic ester resin is a cyanic ester containing a polyphenol, such as bisphenol A, bisphenol F, or novolac. The cyanic ester resin may be used in combination with a complex containing a transition metal, such as cobalt, copper, zinc, or manganese, as a curing catalyst. The curing catalyst is useful in lowering a curing temperature of the cyanic ester resin.

These thermosetting resins may also be used in combination as needed basis. For example, the maleimide resin, the cyanic ester resin, and the epoxy resin can be used in combination.

Curing Agent

If the epoxy resin is used as the thermosetting resin, the thermosetting resin composition including the epoxy resin is blended with the curing agent.

A variety of traditionally-known curing agents may be used; and examples of the curing agents include multifunctional phenols such as dicyandiamide, diaminodiphenylmethane, diaminodiphenylsulfone, phthalic anhydride, pyromellitic anhydride, phenol novolac, and cresol novolac. These multifunctional phenols may be used independently or in combination of two or more kinds thereof.

Curing Accelerator

The curing accelerator may be blended in order to accelerate the curing of the thermosetting resin composition; and as long as the curing accelerator does not hinder the advantageous effects of the present invention, a kind and a blending amount thereof are not particularly limited.

As examples of the curing accelerator there may be mentioned imidazole-type compounds, organic phosphorus-type compounds, tertiary amines, and quaternary ammonium salts; and these curing accelerators may be used independently or in combination of two or more kinds thereof.

Content

It is usually desirable that the flame retardant for thermosetting resin of the present invention should be contained in the thermosetting resin composition within a range of 1 to 50% by mass.

The flame retardant for thermosetting resin with the content in the above range is capable of imparting excellent flame retardancy to the thermoset resin article and is capable of providing the thermoset resin article with excellent heat resistance and dielectric property.

It is not desirable if the content of the flame retardant is less than 1% by mass, as it may not be possible to impart physical properties sufficiently, such as the flame retardancy, to the thermoset resin article. Meanwhile, it is not desirable if the content of the flame retardant exceeds 50% by mass, as it may be possible to deteriorate physical properties, particularly mechanical properties, of the thermoset resin article itself.

The content of the flame retardant is more preferably 5 to 35% by mass and particularly preferably 10 to 30% by mass.

The specific contents (% by mass) of the flame retardant in the thermosetting resin composition are, for example, 1, 5, 8, 10, 11, 12, 13, 14, 15, 16, 17, 18, 19, 20, 21, 22, 23, 24, 25, 26, 27, 28, 29, 30, 32, 35, 40, 45, and 50.

Additional Components

The thermosetting resin composition of the present invention may contain additional components, which are usually added to resins, as long as the advantageous effects of the present invention are not impaired by the additional components. As examples of the additional components there may be mentioned resin materials, such as commonly-known thermoplastic resins and elastomers, inorganic fillers, coupling agents, antioxidants, thermostabilizers, antistatic agents, ultraviolet absorbers, pigments, coloring agents, and lubricants; and these additional components may be used independently or in combination of two or more kinds thereof.

4. Method for Preparing Thermosetting Resin Composition

The thermosetting resin composition of the present invention may be prepared by any commonly-known method with use of the flame retardant for thermosetting resin and the thermosetting resin described above and the other components as needed.

Specifically, Examples will go into detail about examples using the epoxy resin.

5. Thermoset Resin Article

The thermoset resin article of the present invention is made by curing the above thermosetting resin composition by a commonly-known method.

The specific method will be detailed in Examples using the epoxy resin.

6. Prepreg

A prepreg of the present invention contains the thermosetting resin composition of the present invention and can be prepared by a commonly-known method with use of the thermosetting resin composition of the present invention and a commonly-known base material.

For example, the prepreg of the present invention can be prepared by impregnating the base material with the thermosetting resin composition of the present invention, which has been dissolved in a solvent, or by applying this thermosetting resin composition to the base material, and then by drying the thermosetting resin composition-impregnated base material or the thermosetting resin composition-coated base material.

Base Material

The base material is not particularly limited, as long as the base material can be impregnated with the thermosetting resin composition of the present invention, which has been dissolved in the solvent, or can be covered with this thermosetting resin composition. The base material may be any commonly-known material that is used for various printed wiring board materials; and examples of the base material include inorganic fibers except glass, such as glass fibers and quartz; organic fibers, such as polyimide, polyamide, and polyester; and woven cloth, such as liquid crystalline polyester.

The base material may be in any form, for example, woven cloth, such as plain weave, twill weave, or hybrid cloth, or non-woven cloth.

Solvent

The solvent is not particularly limited, as long as the solvent allows the thermosetting resin composition of the present invention to be dissolved therein; and examples of the solvent include ethers, such as ethylene glycol monomethyl ether and propylene glycol monomethyl ether; ketones, such as acetone, diethyl ketone, and methyl ethyl ketone (MEK); and aromatics, such as benzene and toluene.

7. Laminate Sheet

A laminate sheet of the present invention is prepared using the prepreg of the present invention and can be prepared by a commonly-known method. For example, the prepreg and other base materials to be used as needed are laminated, forming a laminate; and the laminate is heated under pressure and cured, forming the laminate with a desired size and shape.

8. Printed Wiring Board

A printed wiring board of the present invention is prepared by using the prepreg or the laminate sheet of the present invention, and can be prepared by a commonly-known method.

EXAMPLES

The present invention will be described in detail by way of Synthesis Examples and Test Examples (Examples and Comparative Examples) below; however, the scope of the present invention is not limited to these Examples in the Test Examples.

Identification of Aromatic Phosphoric Acid Esters

Aromatic phosphoric acid esters obtained by Synthesis Examples were identified with use of the following measuring device (1H-NMR) and under the following condition.

Measuring device: $^1$H-NMR (model: JNM-ECS-400) manufactured by JEOL Ltd.

Solvent: $CDCl_3$

Evaluation of Thermoset Resin Articles

The thermoset resin articles obtained by Examples and Comparative Examples were evaluated by the following method with use of the following measuring device and under the following condition.

Flame Retardancy
- Test method: according to K7201-2 (test method for flammability based on oxygen index (LOI value)) of JIS standards
- Test piece: ⅛ inch (3.2 mm) in thickness
- Measuring device: flammability tester (model: ON-1) manufactured by Suga Test Instruments Co., Ltd.

Permittivities and Dielectric Tangents

Permittivity and dielectric tangent of the evaluative thermoset resin articles each were measured at 1 GHz by an impedance analyzer (model: E4991A, manufactured by Agilent Technologies Japan, Ltd.).

Glass-Transition Temperatures

A glass-transition temperature of the thermoset resin articles each was measured by a differential scanning calorimeter (model: DSC6220, manufactured by Seiko Instruments Inc.). The glass-transition temperature was defined as a temperature at which ADSC between room temperature and 200° C. is at its maximum if the temperature rises at a rate of 10° C./min.

Evaluation of Flame Retardants for Thermosetting Resin 5 g of a flame retardant was added repeatedly to 100 mL of the following respective solvents at a temperature of 20° C. until the undissolved flame retardant was detected; and a largest amount of the flame retardant dissolved was measured. This largest amount was considered to be solvent solubility.

- Solvents: toluene, methyl ethyl ketone (MEK), and propylene glycol monomethyl ether (PM)

Materials for Synthesizing Aromatic Phosphoric Acid Esters

In Synthesis Examples, the following compounds were used as materials:
- 2,6-Xylenol (manufactured by Tokyo Chemical Industry Co., Ltd.)
- Phosphorus oxychloride (manufactured by Tokyo Chemical Industry Co., Ltd.)
- Bisphenol 1
  3,3,5-trimethyl-1,1-bis(4-hydroxyphenyl)cyclohexane (product name: BisP-HTG, manufactured by Honshu Chemical Industry Co., Ltd. and represented by the following structural formula):

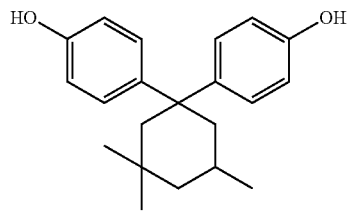 [SMILES: CC1CC(C)(C)CC(c2ccc(O)cc2)(c2ccc(O)cc2)C1]

Bisphenol 2
1,1-bis(4-hydroxyphenyl)cyclododecane (product name: BisP-CDE, manufactured by Honshu Chemical Industry Co., Ltd. and represented by the following structural formula):

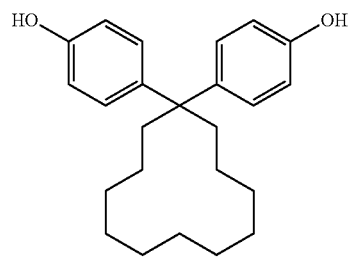 [SMILES: Oc1ccc(C2(c3ccc(O)cc3)CCCCCCCCCCC2)cc1]

Materials for Thermosetting Resin Compositions
In Test Examples, the following compounds were used as materials:
- Epoxy resin (product name: jER828, manufactured by Mitsubishi Chemical Corporation)
- Curing agent (product name: RIKACID MH-700, manufactured by New Japan Chemical Co., Ltd.)
- Curing accelerator (product name: 2,4,6-tris(dimethylaminomethyl)phenol, manufactured by Tokyo Chemical Industry Co., Ltd.)

Flame Retardants
- FR1: aromatic phosphoric acid ester 1
- FR2: aromatic phosphoric acid ester 4
- FR3: 1,3-phenylenebis(di-2,6-xylyl phosphate) (product name: PX-200, manufactured by Daihachi Chemical Industry Co., Ltd.)
- FR4: cyclophosphazene oligomer (product name: SPB-100, having 13% by mass of phosphorus and manufactured by Otsuka Chemical Co., Ltd.)
- FR5: 9,10-dihydro-9-oxa-10-phosphaphenanthrene-10-oxide (product name: HCA, manufactured by Sanko Co., Ltd.)

Synthesis of Phosphoric Acid Esters

Synthesis Example 1: Synthesis of Dixylylphosphorochloridate

A 2-liter capacity four-necked flask equipped with a stirrer, a thermometer, and a hydrochloric acid collecting device (condenser connected with a water scrubber) was filled with 767 g of phosphorus oxychloride, 1,200 g of 2,6-xylenol, 140 g of xylene as a solvent, and 6.2 g of magnesium chloride as a catalyst.

The resulting mixed solution was gradually heated to a temperature of 160° C. over about 3 hours while stirred and was allowed for a reaction, and hydrogen chloride (hydrochloric acid gas) produced from the reaction was collected with the water scrubber. Thereafter, a pressure in the flask was gradually reduced to 20 kPa at the same temperature (160° C.); and xylene, unreacted phosphorus oxychloride and 2,6-xylenol, and hydrogen chloride as a byproduct were removed, obtaining 1,700 g of the reaction mixture mainly containing dixylylphosphorochloridate represented by the following structural formula. A content rate of chlorine in the reaction mixture was 10.9% by mass.

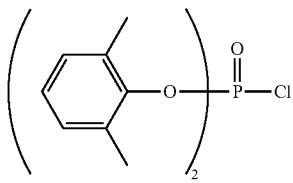

Synthesis Example 2: Synthesis of Aromatic Phosphoric Acid Ester 1

A two-liter capacity four-necked flask equipped with a stirrer, a thermometer, a dropping funnel, and a condenser was filled with 460 g of the dixylylphosphorochloridate obtained in Synthesis Example 1, 196 g of bisphenol 1, 540 g of toluene as a solvent, and 140 g of tetrahydrofuran. The dropping funnel was filled with 151 g of triethylamine as a hydrogen halide scavenger.

The mixed solution in the four-necked flask was heated to a temperature of 65° C. while stirred; and the triethylamine in the dropping funnel was dropped into the mixed solution over 1 hour and 30 minutes while the same temperature (65° C.) was maintained. After the dropping was completed, the resulting mixed solution was stirred for 2 hours at the same temperature (65° C.), obtaining a reaction product.

The reaction product thereby obtained was washed with dilute hydrochloric acid and water, and was neutralized and washed with a sodium hydroxide aqueous solution, and then was washed again with water. After that, the reaction product was heated to a temperature of 110° C.; and the pressure was reduced to 1 kPa, collecting water, toluene, and tetrahydrofuran. Further, under the reduced pressure of 1 kPa, the reaction product was subjected to steam distillation at a temperature of 110° C., removing low-boiling components; and the reaction product was cooled to room temperature, thereby obtaining 553 g of a pale yellow transparent glassy solid.

Figure 2:
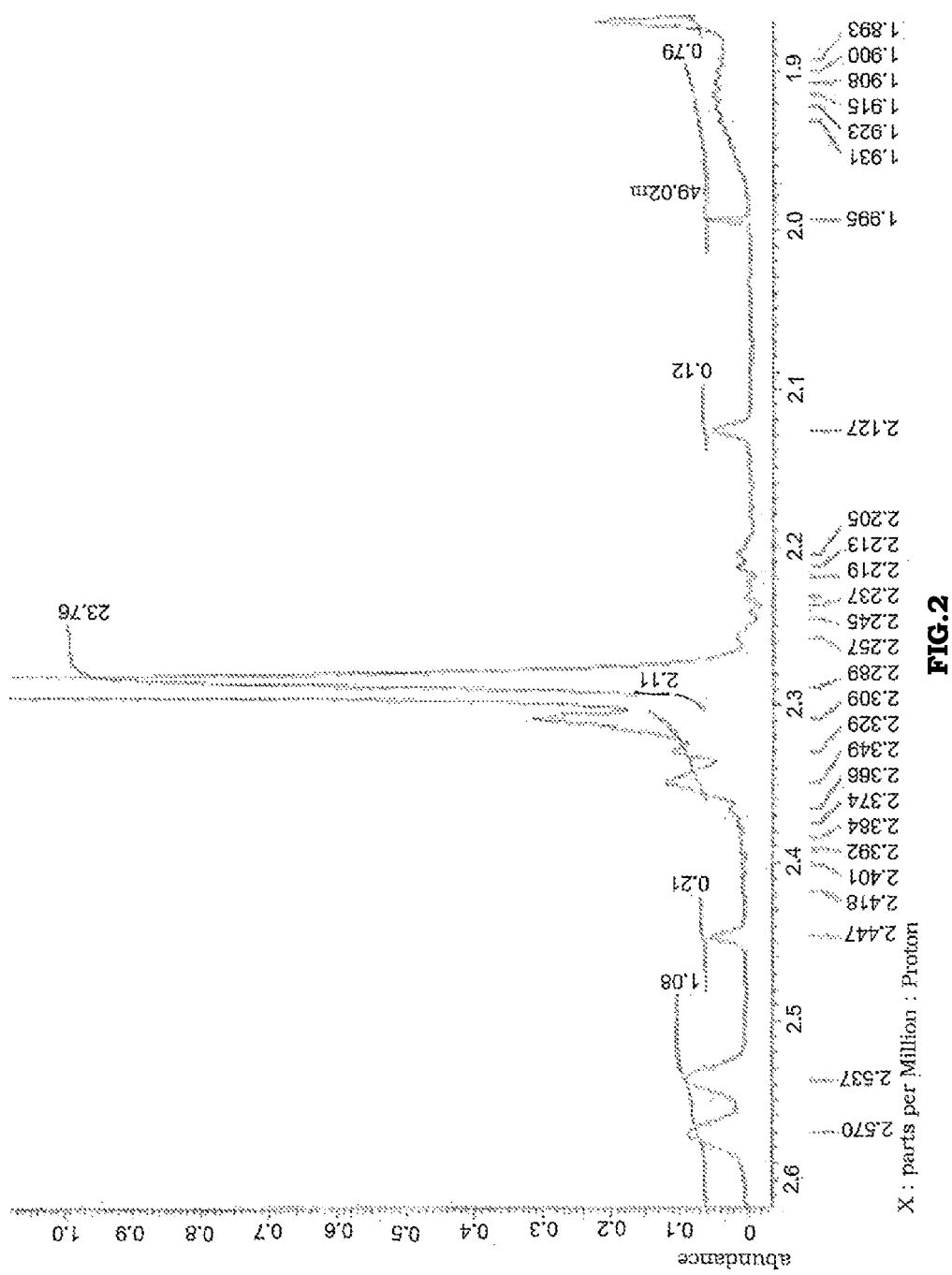
FIG. 2 shows an enlarged view of a region A of FIG. 1.
Figure 3:
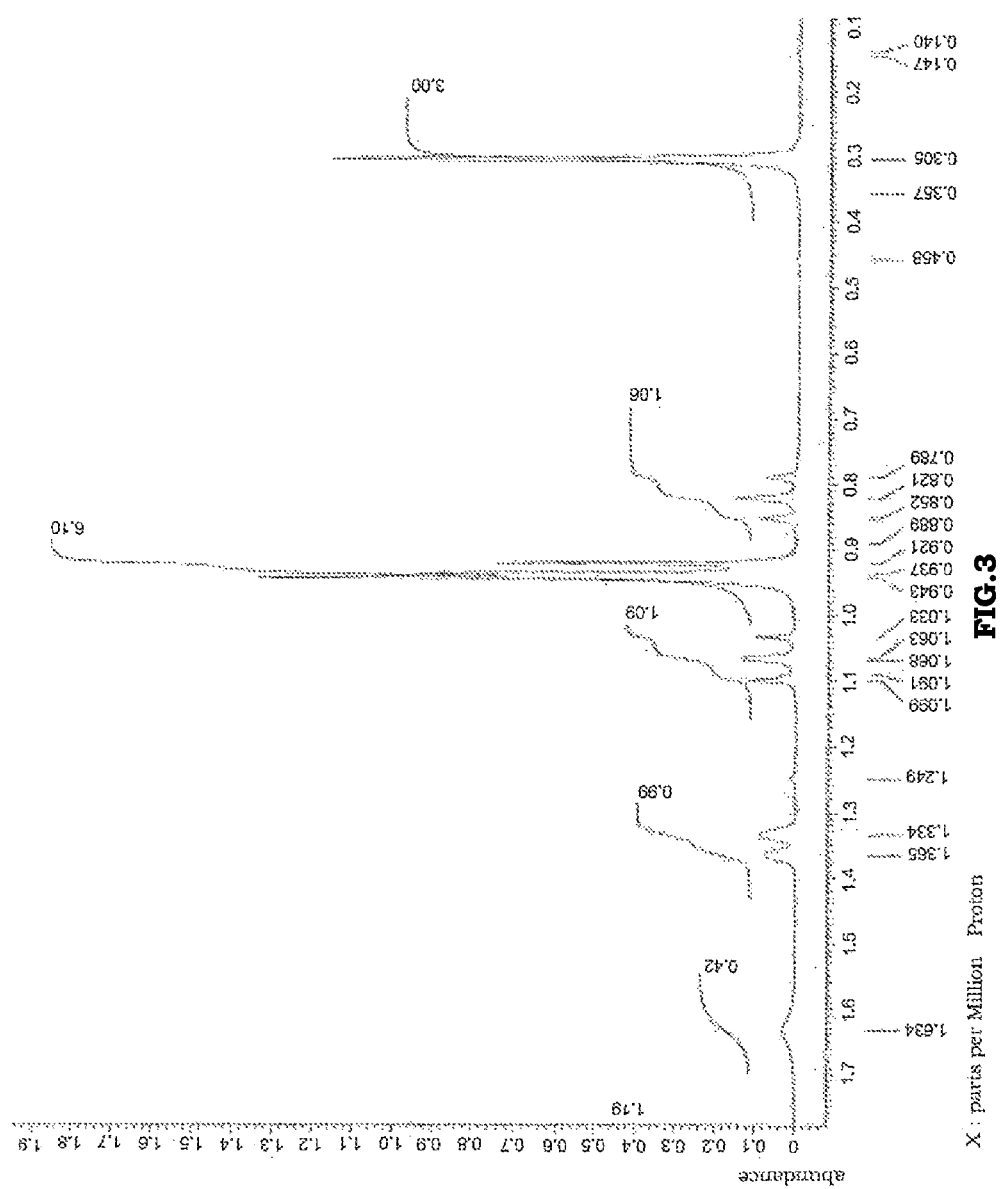
FIG. 3 shows an enlarged view of a region B of FIG. 1.

It was confirmed by $^1$H-NMR that the product thereby obtained contained, as a main component, aromatic phosphoric acid ester 1 represented by the following structural formula. A $^1$H-NMR chart is shown in FIGS. 1 to 3.

The term "H number" in FIGS. 1 to 3 and in FIG. 4 to be shown below indicates the number of hydrogen atoms. For example, "H 20" represents twenty (20) hydrogen atoms.

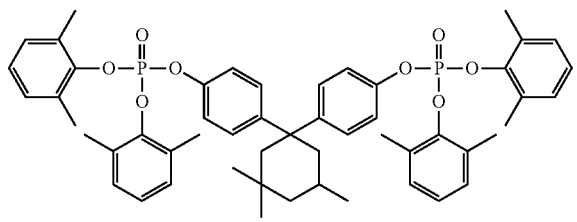 [SMILES: Cc1cccc(C)c1OP(=O)(Oc1ccc(C2(c3ccc(OP(=O)(Oc4c(C)cccc4C)Oc4c(C)cccc4C)cc3)CC(C)CC(C)(C)C2)cc1)Oc1c(C)cccc1C]

Synthesis Example 3: Synthesis of Aromatic Phosphoric Acid Ester 4

569 g of a pale yellow transparent glassy solid was obtained in the same manner as in Synthesis Example 2, except that 216 g of bisphenol 2 was used instead of bisphenol 1.

It was confirmed by $^1$H-NMR that the product thereby obtained contained, as a main component, aromatic phosphoric acid ester 4 represented by the following structural formula. A $^1$H-NMR chart is shown in FIG. 4.

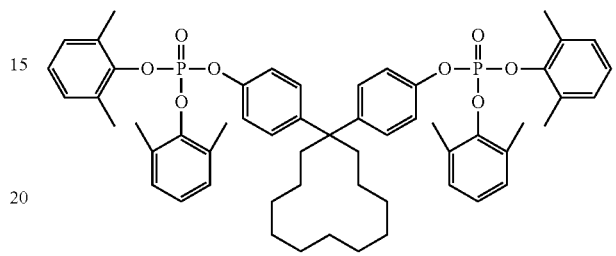

Test Example 1: Evaluation of Flame Retardants for Thermosetting Resin in Thermoset Epoxy Resin Articles The epoxy resin and the flame retardant were mixed at a blending ratio shown in Table 1, and were evenly dissolved while heated at a temperature of 150° C. To the mixture, the curing agent and the curing accelerator were added at a blending ratio shown in Table 1; and the resulting mixture was evenly mixed. After that, the liquid resin composition thereby obtained was poured into a 3.2 mm-thick mold, and was heated at a temperature of 120° C. for 2 hours and then at a temperature of 170° C. for 5 hours, obtaining a thermoset epoxy resin article for evaluation.

The thermoset epoxy resin articles thereby obtained were evaluated for their flame retardancy, dielectric property, and a glass-transition temperature by the above-described methods.

A thermoset epoxy resin article for evaluation without containing a flame retardant was also prepared and evaluated in the same manner (see Comparative Example 7: blank). Evaluation results of the blank-especially the flame retardancy (oxygen index)—are considered comparative criteria for evaluating the flame retardants blended in the thermoset epoxy resin articles.

The results obtained by the measurements are shown in Tables 1 and 2.

TABLE 1

|  |  |  | Ex 1 | Ex 2 | Ex 3 | Comp Ex 1 | Comp Ex 2 | Comp Ex 3 | Comp Ex 4 | Comp Ex 5 | Comp Ex 6 | Comp Ex 7 (blank) |
|---|---|---|---|---|---|---|---|---|---|---|---|---|
| Materials* | Epoxy resin |  | 53.1 | 53.1 | 53.1 | 53.1 | 53.1 | 57.9 | 53.1 | 53.1 | 53.1 | 53.1 |
|  | Curing agent |  | 46.9 | 46.9 | 46.9 | 46.9 | 46.9 | 42.1 | 46.9 | 46.9 | 35.9 | 46.9 |
|  | Curing accelerator |  | 0.5 | 0.5 | 0.5 | 0.5 | 0.5 | 0.5 | 0.5 | 0.5 | 0.5 | 0.5 |
|  | Flame retardants | FR1 | 27.3 | — | — | — | — | — | — | — | — | — |
|  |  | FR2 | — | 29 | 27.3 | — | — | — | — | — | — | — |
|  |  | FR3 | — | — | — | 20 | — | — | 27.3 | — | — | — |
|  |  | FR4 | — | — | — | — | 13 | — | — | 27.3 | — | — |
|  |  | FR5 | — | — | — | — | — | 11.7 | — | — | 27.3 | — |
|  | Phosphorus content** (% by mass) |  | 1.5 | 1.5 | 1.4 | 1.5 | 1.5 | 1.5 | 1.9 | 2.8 | 3.1 | 0 |
| Evaluation | Flame retardancy (oxygen index: LOI value) |  | 34.2 | 32.5 | 33.3 | 34.6 | 32.9 | 36.4 | 35.5 | 21.9 | 31.1 | 19.7 |

TABLE 1-continued

|  | Ex 1 | Ex 2 | Ex 3 | Comp Ex 1 | Comp Ex 2 | Comp Ex 3 | Comp Ex 4 | Comp Ex 5 | Comp Ex 6 | Comp Ex 7 (blank) |
|---|---|---|---|---|---|---|---|---|---|---|
| Permittivity (1 GHz) | 2.64 | 2.73 | 2.92 | 2.74 | 2.80 | 2.89 | 2.91 | 3.06 | 3.14 | 2.78 |
| Dielectric tangent (1 GHz, × $10^{-3}$) | 6.6 | 6.6 | 6.7 | 6.4 | 8.6 | 10.1 | 5.8 | 8.2 | 9.2 | 9.1 |
| Glass-transition temp (° C.) | 118.7 | 121.7 | 123.0 | 107.6 | 125.1 | 114.6 | 102.8 | 108.9 | 103.1 | 154.4 |

*A unit of the blending ratio of the materials is part by mass.
**The phosphorus content is a theoretical value of the phosphorus content in each thermosetting resin composition.

Test Example 2: Evaluation of Flame Retardants for Thermosetting Resin

Flame retardants FR1 to FR4 as the flame retardants for thermosetting resin were evaluated for solvent solubility by the above method.

The results obtained are shown in Table 2.

TABLE 2

| | Solvent solubility (g/100 mL) | | |
|---|---|---|---|
| | Toluene | MEK | PM |
| FR1 | 140 | 135 | 85 |
| FR2 | 130 | 50 | 10 |
| FR3 | 75 | 55 | 10 |
| FR4 | 30 | 35 | <5 |
| FR5 | <5 | 5 | 15 |

The following are found from the results shown in Tables 1 and 2:
(1) The thermoset resin articles (Examples 1 to 3) blended with the flame retardant of the present invention (FR1 or FR2) clearly have the flame retardancy imparted thereto.
(2) The following are found from the tests (Examples 1 and 2 and Comparative Examples 1 to 3) for the thermosetting resin compositions respectively containing the flame retardants of the present invention (FR1 and FR2) and the traditionally-known phosphorus-type flame retardants (FR3 to FR5), all of which having a certain phosphorus content:
The thermoset resin articles respectively blended with FR1, FR2, and FR3 do not have a significant difference in the dielectric property; however, the thermoset resin article (Example 1 or 2) blended with FR1 or FR2 inhibits a decrease in heat resistance of the thermoset resin article more than the thermoset resin article (Comparative Example 1) blended with FR3 even though the former have the higher amount of the flame retardant.
The thermoset resin article (Example 1 or 2) blended with FR1 or FR2 is superior in dielectric property to the thermoset resin article blended with FR4 or FR5 (Comparative Example 2 or 3).
(3) The flame retardants of the present invention (FR1 and FR2) are superior in solvent solubility to the traditionally-known phosphorus-type flame retardants (FR4 and FR5), and are more readily uniformly dispersed in the thermoset resin article at the time of the preparation of the laminate sheet.
(4) The following are found from the tests (Examples 1 and 3 and Comparative Examples 4 to 6) for the flame retardants of the present invention (FR1 and FR2) and the traditionally-known phosphorus-type flame retardants (FR3 to FR5), all of which having a certain blend amount:
The thermoset resin articles respectively blended with FR1, FR2, and FR3 do not have a significant difference in the dielectric property; however, the thermoset resin article (Comparative Example 4) blended with FR3 is significantly lower in heat resistance than the thermoset resin article blended with FR1 or FR2 (Example 1 or 3).
The thermoset resin article (Comparative Example 5 or 6) blended with FR4 or FR5 tends to be higher in permittivity and dielectric tangent than the thermoset resin article (Example 1 or 3) blended with FR1 or FR2, and is significantly lower in heat resistance than the latter.

From the above, it is realized that the flame retardants (flame retardants for thermosetting resin) of the present invention, such as FR1 and FR2, are more readily dispersed in the thermoset resin article than the traditionally-known phosphorus-type flame retardants, such as FR3 to FR5, and are capable of allowing the thermoset resin article to successfully have both the dielectric property and the heat resistance.

The invention claimed is:
1. A thermosetting resin composition containing a flame retardant for thermosetting resin the flame retardant containing an aromatic phosphoric acid ester represented by the general formula (II):

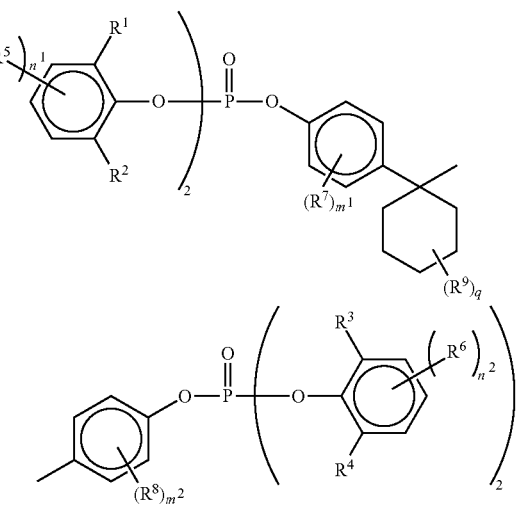

(II)

wherein $R^1$ to $R^4$ each independently represent a $C_{1-4}$ alkyl group or a $C_{1-4}$ alkoxy group; $R^5$, $R^6$, and $R^9$ each independently represent a $C_{1-10}$ alkyl group or a $C_{1-10}$ alkoxy group; $R^7$ and $R^8$ each independently represent a $C_{1-4}$ alkyl group or a $C_{1-4}$ alkoxy group; $n^1$ and $n^2$ each independently represent an integer of 0 to 3; $m^1$ and $m^2$ each independently represent an integer of 0 to 4; q represents an integer of 0 to 10, and a thermosetting resin.

2. The thermosetting resin composition according to claim 1, wherein the thermosetting resin is an epoxy resin.

3. The thermosetting resin composition according to claim 1, wherein the flame retardant for thermosetting resin of 1 to 50% by mass is contained in the thermosetting resin composition.

4. A thermoset resin article formed by curing the thermosetting resin composition according to claim 1.

5. A prepreg containing the thermosetting resin composition according to claim 1.

6. A laminate sheet prepared using the prepreg according to claim 5.

7. A printed wiring board prepared using the laminate sheet according to claim 6.

8. A printed wiring board prepared using the prepreg according to claim 5.

9. The thermosetting resin composition according to claim 1, wherein the aromatic phosphoric acid ester is:
an aromatic phosphoric acid ester 1 represented by the following formula:

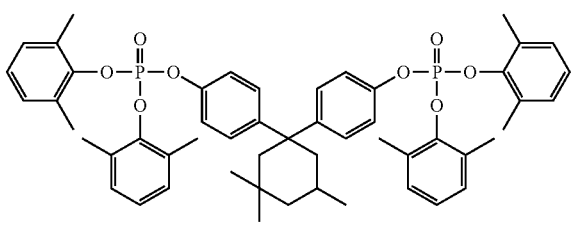 [SMILES: Cc1cccc(C)c1OP(=O)(Oc1ccc(C2(c3ccc(OP(=O)(Oc4c(C)cccc4C)Oc4c(C)cccc4C)cc3)CC(C)CC(C)(C)C2)cc1)Oc1c(C)cccc1C]

an aromatic phosphoric acid ester 2 represented by the following formula:

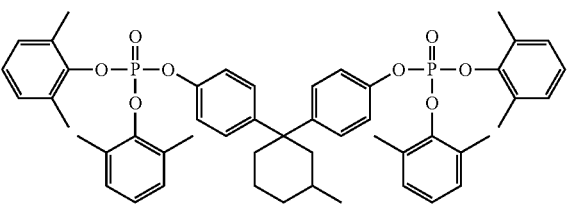 [SMILES: Cc1cccc(C)c1OP(=O)(Oc1ccc(C2(c3ccc(OP(=O)(Oc4c(C)cccc4C)Oc4c(C)cccc4C)cc3)CCCC(C)C2)cc1)Oc1c(C)cccc1C]

or an aromatic phosphoric acid ester 3 represented by the following formula:

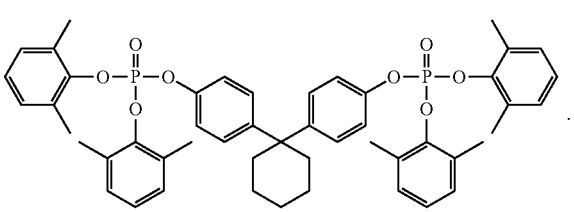 [SMILES: Cc1cccc(C)c1OP(=O)(Oc1ccc(C2(c3ccc(OP(=O)(Oc4c(C)cccc4C)Oc4c(C)cccc4C)cc3)CCCCC2)cc1)Oc1c(C)cccc1C]

* * * * *